United States Patent [19]
Bui et al.

[11] Patent Number: 5,786,705
[45] Date of Patent: Jul. 28, 1998

[54] METHOD FOR EVALUATING THE EFFECT OF A BARRIER LAYER ON ELECTROMIGRATION FOR PLUG AND NON-PLUG INTERCONNECT SYSTEMS

[75] Inventors: Nguyen Duc Bui, San Jose; John T. Yue, Los Altos; Van Pham, Milpitas, all of Calif.

[73] Assignee: Advanced Micro Devices, Inc., Sunnyvale, Calif.

[21] Appl. No.: 747,803

[22] Filed: Nov. 14, 1996

Related U.S. Application Data

[60] Continuation of Ser. No. 445,204, May 23, 1995, abandoned, which is a division of Ser. No. 348,645, Dec. 1, 1994, Pat. No. 5,612,627.

[51] Int. Cl.⁶ .................................................. G01R 27/26
[52] U.S. Cl. .......................... 324/766; 324/716; 324/719
[58] Field of Search ............................ 324/158.1, 73.1, 324/765, 719, 713, 703, 716, 769; 437/8; 257/40, 48; 29/825; 438/14–18

[56] References Cited

U.S. PATENT DOCUMENTS

| | | | |
|---|---|---|---|
| 3,474,530 | 10/1969 | Ainslie et al. | 324/158.1 |
| 3,878,442 | 4/1975 | Bhatt | 29/825 |
| 4,483,629 | 11/1984 | Schwarz et al. | 324/158.1 |
| 4,652,812 | 3/1987 | Gimpelson et l. | 324/158.1 |
| 4,970,574 | 11/1990 | Tsunenari | 257/753 |
| 5,291,142 | 3/1994 | Ohmi | 324/158.1 |
| 5,420,513 | 5/1995 | Kimura | 324/719 |

*Primary Examiner*—Vinh P. Nguyen
*Attorney, Agent, or Firm*—Skjerven, Morrill, MacPherson, Franklin & Friel LLP; Edward C. Kwok

[57] ABSTRACT

A substantially constant current is conducted in a first direction through an interconnect structure having a barrier layer to determine the lifetime of the structure in the first current direction. A substantially identical current is conducted in a second direction through a substantially identical interconnect structure to determine the lifetime of the structure in the second current direction. These tests are repeated for identical structures but having different barrier layer thicknesses. The results of these lifetime tests are compared to determine the barrier layer's effect on electromigration in the structure, which can be used to design the barrier layer to optimize the structure's lifetime and speed.

11 Claims, 5 Drawing Sheets

METHOD FOR EVALUATING THE EFFECT OF A BARRIER LAYER ON ELECTROMIGRATION FOR PLUG AND NON-PLUG INTERCONNECT SYSTEMS

This application is a continuation of application Ser. No. 08/445,204, filed on May 23,1995, now abandoned, which is a division of application Ser. No. 08/348,645, filed Dec. 1, 1994, now U.S. Pat No. 5,612,627.

FIELD OF THE INVENTION

This invention relates to test methods used in integrated circuit manufacturing, and particularly, to test methods for analyzing the effect of a barrier layer on electromigration for plug and non-plug interconnect systems.

BACKGROUND

Many integrated circuits have two or more metal layers for interconnecting devices in the integrated circuit. FIG. 1 shows a cross-sectional view of a two metal layer interconnect structure 100 having a metal-1 layer 110, a metal-2 layer 120, and a via 130 for interconnecting metal-1 110 and metal-2 layer 120. Via 130 has a barrier layer 132 separating metal-1 layer 110 and metal-2 layer 120. Barrier layer 132 is formed by a layer 134 and a layer 136, which in this example, are made of TiN for adhesion of Metal-2 layer 120 and anti-reflective coating (ARC) for Metal-1 layer 110, respectively. Metal-1 and Metal-2 layers 110 and 120 are made of Al or Al alloy.

One of the failure modes of structure 100 is caused by electromigration. Electromigration refers to the physical displacement or scattering of atoms of the conducting medium (e.g., the Al of the metal layers) arising from collisions with electrons moving in the opposite direction of the current. As electromigration occurs, the resistance of the affected metal layer can increase to the point of failure.

Also, barrier layer 132 can be a problem because barrier layer 132 causes via 130 to be more resistive than a purely metal via. Consequently, the speed at which signals propagate through the metal/barrier/metal structure is decreased. The resistance of barrier layer 132 increases with thickness. However, the lifetime of the integrated circuit also increases with barrier thickness (discussed below in conjunction with FIG. 2). Thus, the designer can trade off speed for lifetime by varying the barrier layer thickness.

FIG. 2 illustrates the effects of electromigration near barrier layer 132. A current $I_1$ is conducted from metal-2 layer 120 to metal-1 layer 110 though barrier layer 132. Thus, electrons are moving in the direction opposite of the current; i.e., from metal-1 layer 110 to metal-2 layer 120.

The current density is generally greatest along the "line of least resistance", represented by arrow 200. Thus, the greatest density of the "electron wind" is generally along arrow 200 in the opposite direction. Due to electromigration, Al atoms in metal-2 layer 120 tend to be scattered from areas of metal-2 layer 120 having high current density. As a result, voids 210 in metal-2 layer 120 are created in areas along arrow 200. Consequently, the area (perpendicular to current flow) of metal-2 layer 120 is decreased, which increases the resistance of metal-2 layer 120. As more electromigration occurs, more voids are created causing the resistance of metal-2 layer 120 to increase to a point where the device is considered to have failed.

FIG. 2 also illustrates the conventional method for determining the lifetime of such structures. Current is conducted in one direction until the resistance reaches a predetermined failure criterion. In this example, the current flows from metal-2 layer 120 to metal-1 layer 110. This method measures the lifetime of the structure, but cannot determine the effects of the barrier on the lifetime. For example, because another factor may be the limiting factor on lifetime, varying the barrier's thickness may only change the observed lifetime a relatively small amount when using the conventional method.

SUMMARY

According to one embodiment of the present invention, a substantially constant current is conducted in a first direction through a first metal interconnect structure having a barrier layer to determine the lifetime of the structure in the first current direction. A substantially identical current is conducted in a second direction through a second metal interconnect structure that is substantially identical to the first metal interconnect structure to determine the lifetime of the structure in the second current direction. These tests are repeated for substantially identical structures but having different barrier layer thicknesses. The results of these lifetime tests are compared to determine the barrier layer's effect on electromigration in the structure, which can be used to design the barrier layer to optimize the structure's lifetime and speed.

DETAILED DESCRIPTION

Figure 1:
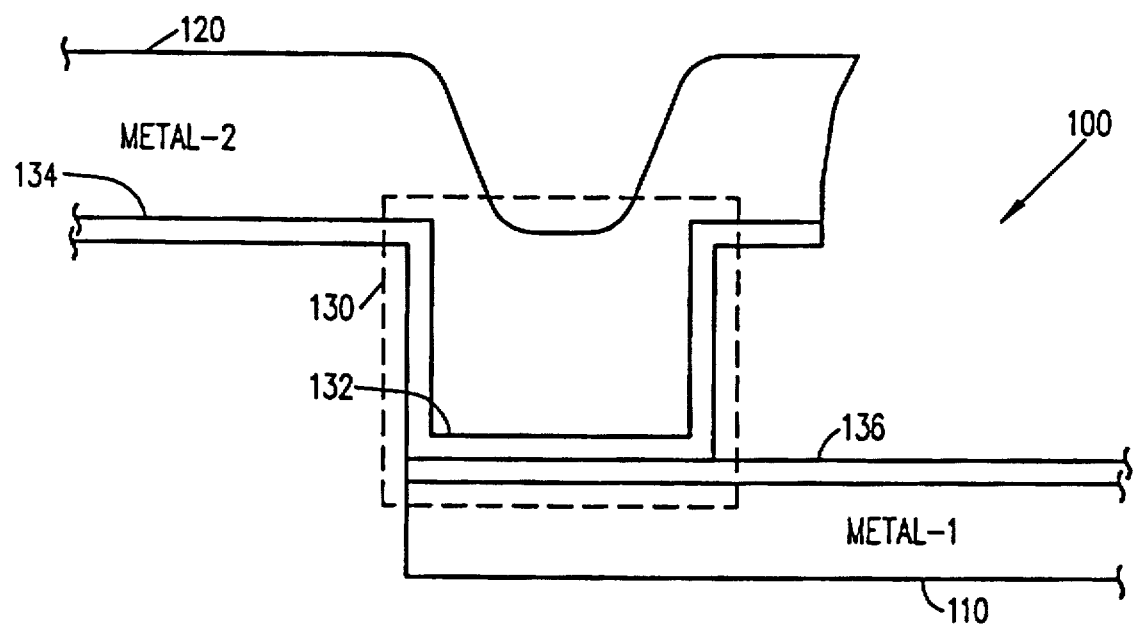
FIG. 1 shows cross-sectional view of a metal interconnect structure having a via with a barrier layer.
Figure 2:
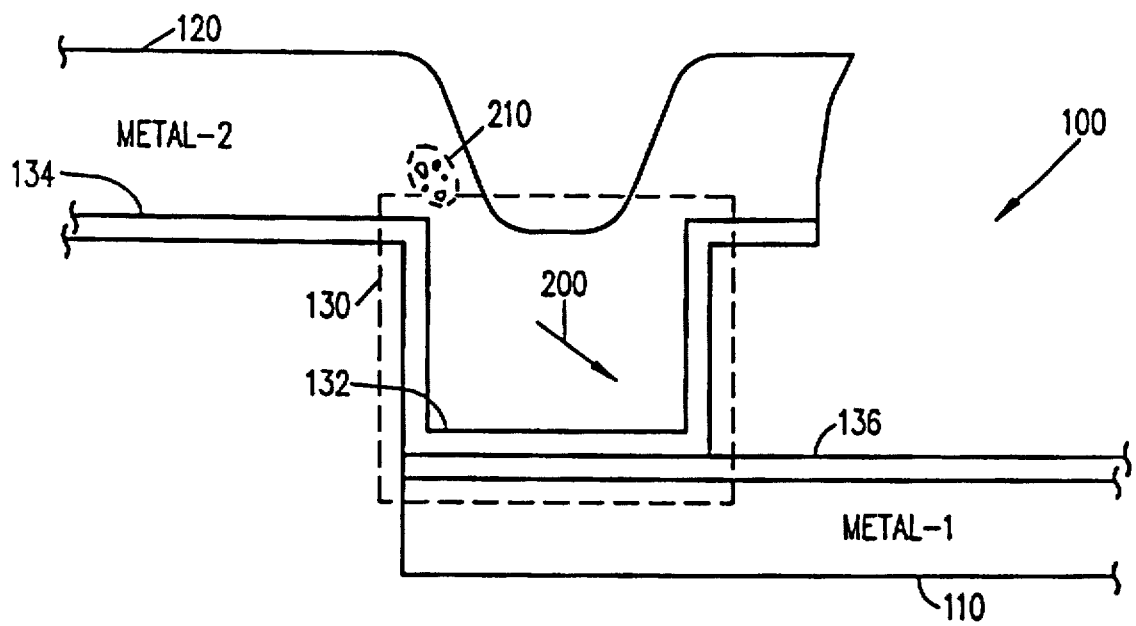
FIG. 2 illustrates electromigration in the metal interconnect structure of FIG. 1.
Figure 3A:
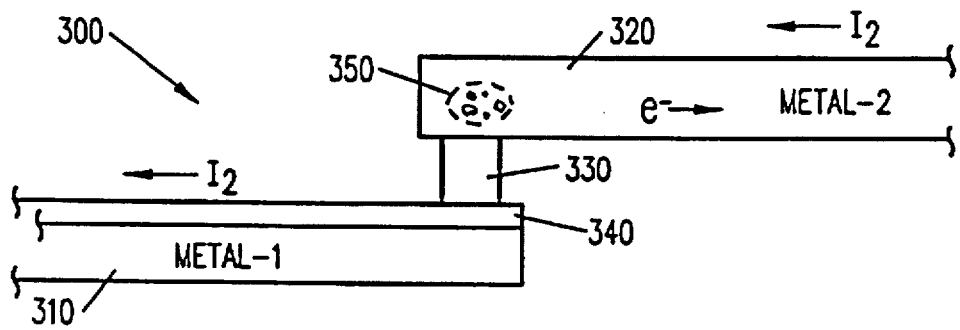
FIGS. 3A–8 illustrate a test methodology testing a via with a plug according to one embodiment of the present invention.

FIG. 3A shows a metal interconnect structure 300 with a conductive plug 330 connecting a metal-1 layer 310 with a metal-2 layer 320. In this example, plug 330 is comprised of tungsten. A barrier layer 340 is located between plug 330 and metal-1 layer 310.

To stress structure 300, a substantially constant current $I_2$ of approximately 75 mA is conducted in the "forward" direction from metal-2 layer 320 to metal-1 layer 310, while the structure is heated to 175° C. As a result, electrons move from metal-1 layer 310 to metal-2 layer 320, causing voids 350 in metal-2 layer 320. The time-to-failure is measured. In this example, structure 300 fails when the increase in the structure's resistance exceeds 20% of the structure's initial resistance. A large number of structures substantially identical to structure 300 are tested to obtain statistical data.

Figure 3B:
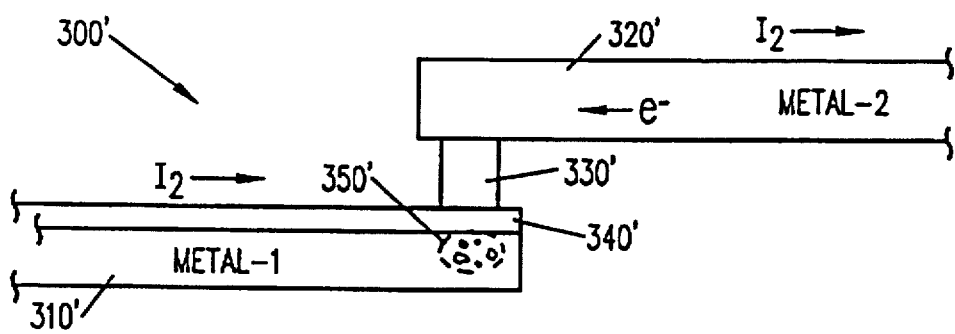

Similarly, FIG. 3B shows a substantially identical metal interconnect structure 300' with a plug 330' and a barrier layer 340' connecting a metal-1 layer 310' with a metal-2 layer 320'. Structure 300' is tested under substantially identical conditions and the same failure criterion as structure 300 (FIG. 3A), except that current $I_2$ is conducted in the "reverse" direction. Consequently, electrons move from metal-2 layer 320' to metal-1 layer 310', causing voids 350' in metal-1 layer 310'. A large number of structures substantially identical to structure 300' are tested to obtain statistical data.

Figure 4:
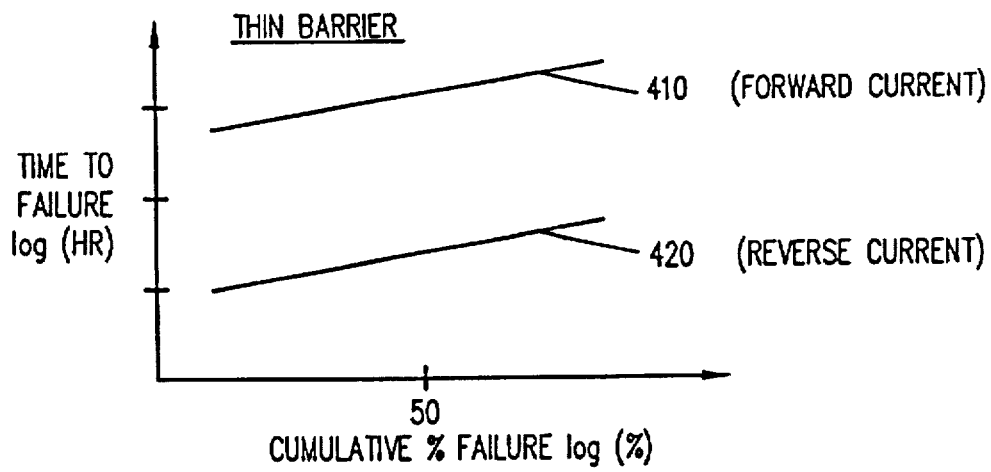

FIG. 4 shows the statistical results of the tests described above in conjunction with FIGS. 3A and 3B (i.e., the "thin barrier" structure). Curve 410 represents the time-to-failure as a function of cumulative % failure of the structures tested according to structure 300 (i.e., forward current). Similarly, curve 420 represents the time-to-failure as a function of cumulative % failure of the structures tested according to structure 300' (i.e., reverse current). FIG. 4 shows that with the reverse current, it takes approximately 2 orders of magnitude longer for approximately 50% of the structures to fail with the forward current as compared to the reverse current. This embodiment of the present invention recognizes that a metal interconnect structure can have a different lifetime depending on the direction of the stress current. Accordingly, it is important that a structure be tested in both current directions to obtain accurate lifetime test results.

By testing different barrier thickness in both directions, the effects of barrier thickness can be characterized, thereby allowing the designer to optimize barrier thickness for structure lifetime and speed.

Figure 5A:
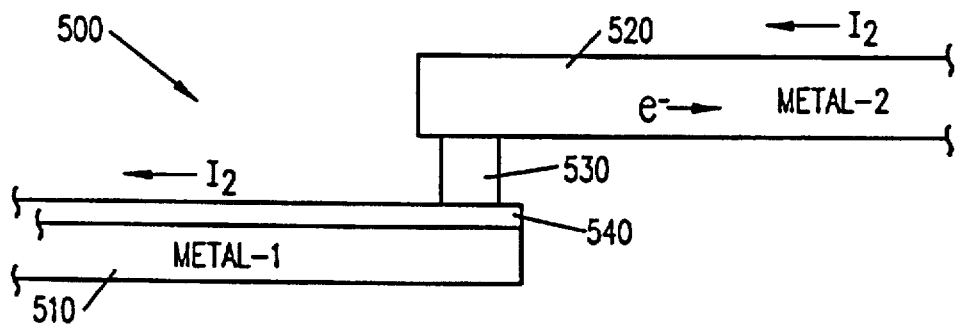
Figure 5B:
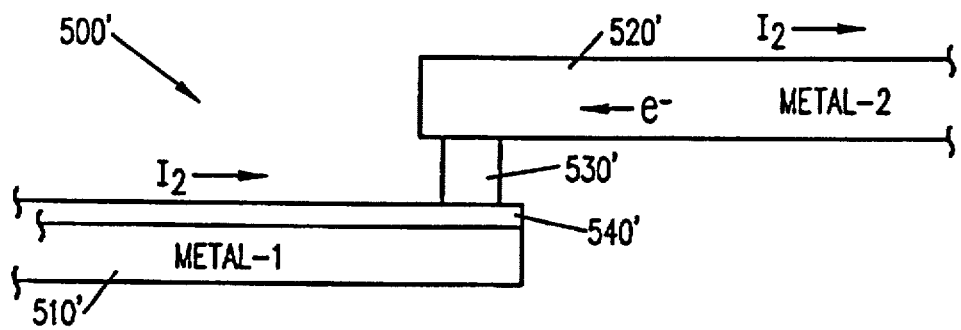

FIGS. 5A and 5B show structures substantially identical to structures 3A and 3B, respectively, with the exception that barrier layers 540 and 540' are approximately twice the thickness of barrier layers 340 and 340'. Structures 500 and 500' are tested under substantially identical conditions as structures 300 and 300'.

Figure 6:
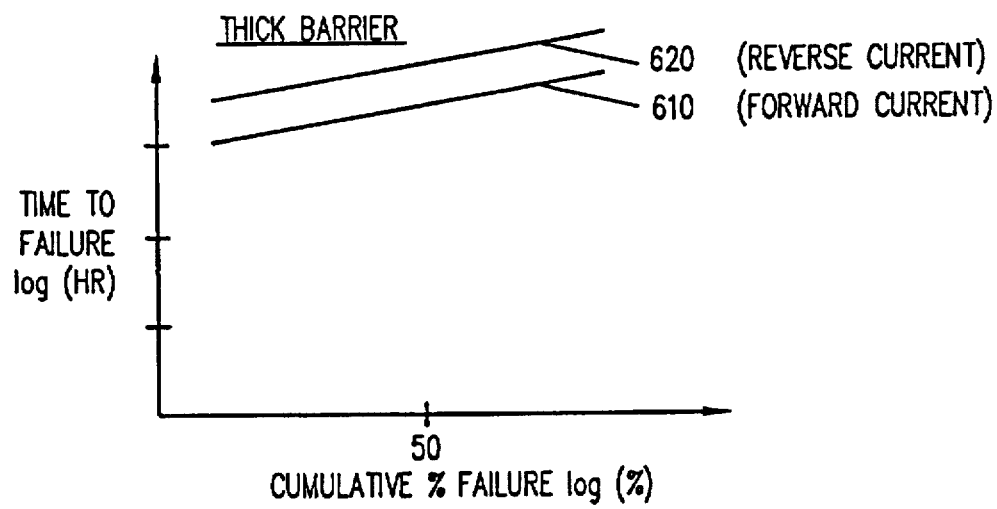
Figure 7A:
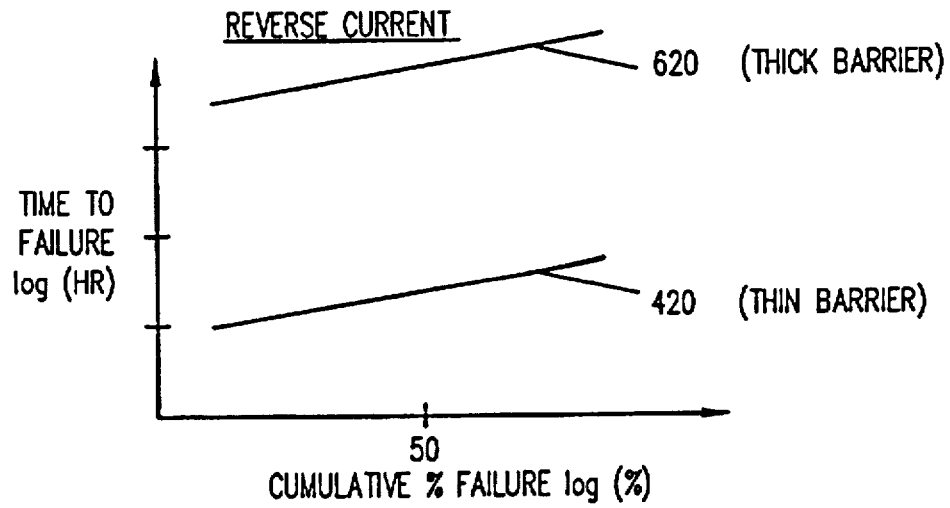

The lifetime data obtained from the testing of structures 500 and 500' are plotted in FIG. 6 (i.e., the "thick barrier" structure). Curve 610 shows the lifetime in the forward current direction, whereas curve 620 shows the lifetime in the reverse current direction. FIG. 6 shows that by increasing barrier thickness, the lifetime of structure 500' is greatly increased. This is shown more clearly in FIG. 7A. Curve 410 (FIG. 4) and curve 620 (FIG. 6) are shown on the same plot in FIG. 7A. By approximately doubling the barrier layer thickness, the lifetime of the structure was increased by approximately two orders of magnitude.

The thickness of the barrier layer affects electromigration of the plug interconnect system as follows. In general, the resistance of the barrier layer increases with barrier thickness. Further, as the resistance of the barrier layer increases, the barrier layer causes the current density across the barrier layer to be more uniform. Consequently, as the current density becomes more uniform, the density of the electron wind is decreased. As a result, electromigration is slowed, thereby increasing the lifetime of the structure. Thus, in general, the lifetime of the structure increases with the barrier layer's thickness.

Figure 7B:
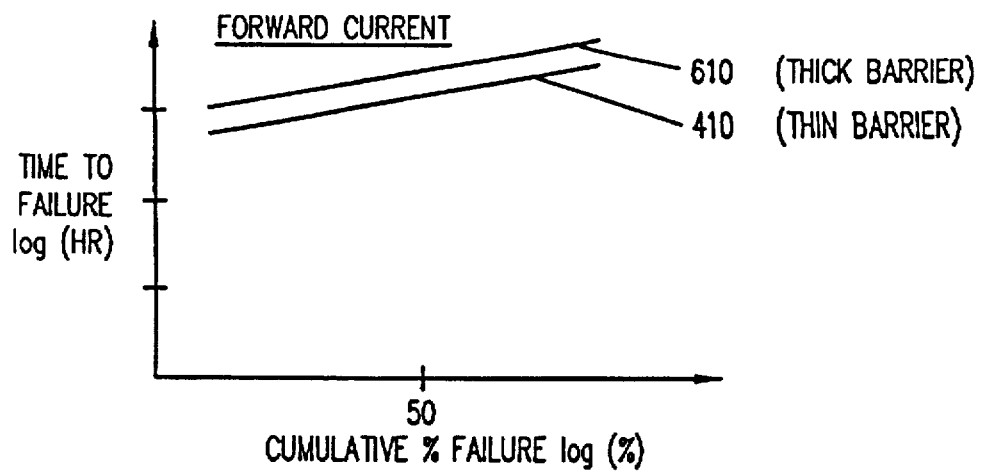

However, in the forward current direction, barrier layer thickness has a less noticeable effect as shown in FIG. 7B. Curve 610 (FIG. 6) and curve 410 (FIG. 4) are shown in the same plot in FIG. 7B and represent the lifetime of the structure in the forward current direction. Increasing barrier layer thickness resulted in only modest increase in lifetime in the forward current direction. This is due in part to the fact that there is no barrier layer separating plug 530 from metal-2 layer 520 (see FIG. 5A). Consequently, the effect of barrier thickness on lifetime is dissipated in the forward current direction.

Figure 8:
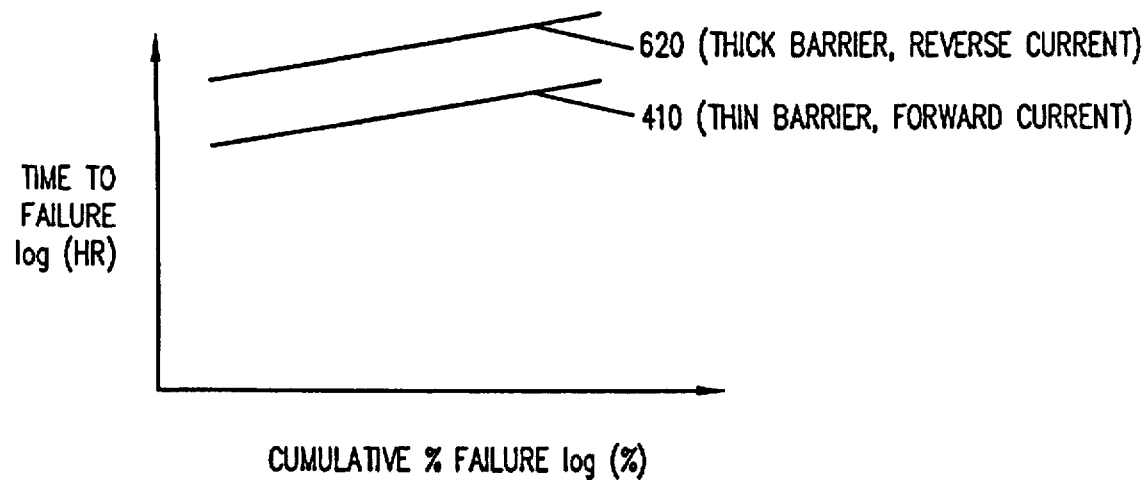

FIG. 8 shows curve 620 (FIG. 6) representing the lifetime with a thick barrier in the reverse current direction plotted together with curve 410 (FIG. 4) representing the lifetime with a thin barrier in the forward current direction. It is clear that the barrier layer thickness can be optimized for lifetime and speed by designing the barrier thickness to be less than the thickness of barrier layer 540' (FIG. 5B) but greater than barrier layer 340 (FIG. 3A). Graphically, this will cause curve 620 to "drop" while causing curve 410 to "rise". At some thickness, the curves will meet, which represents the optimal thickness for the structure's lifetime and speed.

Thus, by using the testing methods describe above, those skilled in the art, for a given process, will be able to characterize the effects of barrier thickness to optimize the thickness for a desired parameter.

Figure 9A:
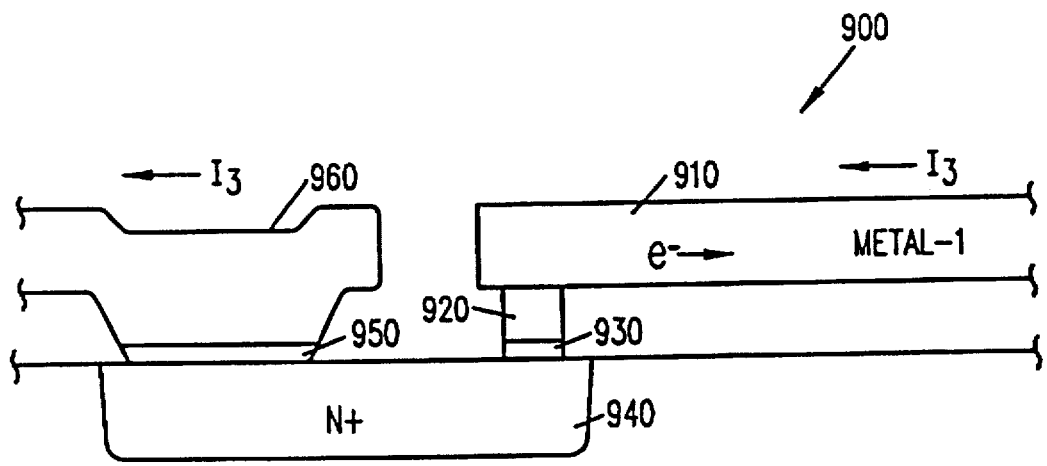
FIGS. 9A and 9B illustrate a test methodology testing a diffusion contact according to another embodiment of the present invention.
Figure 9B:
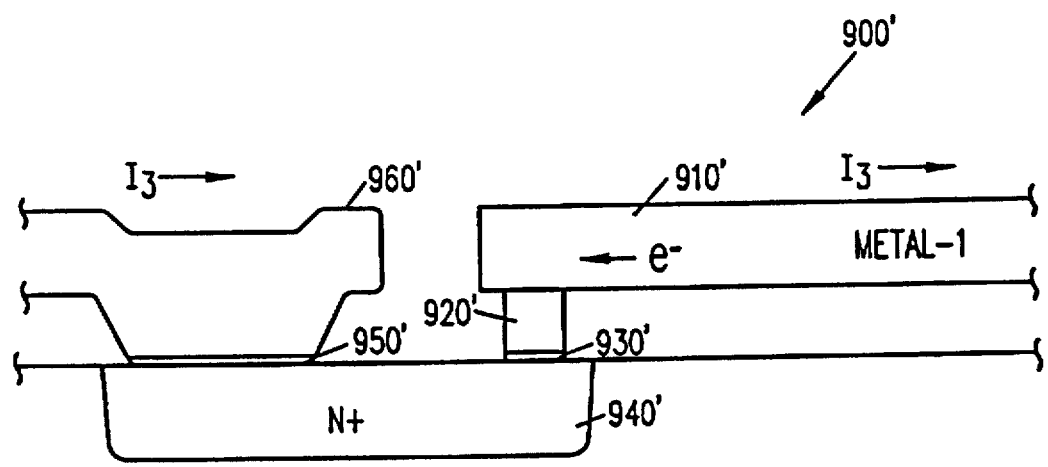

FIGS. 9A and 9B show another embodiment of the invention, adapted for diffusion contacts. FIG. 9A shows a structure 900 including a diffusion contact. A current $I_3$ is conducted from metal-1 layer 910, through plug 920 and barrier layer 930, to N+ diffusion 940. The current exits diffusion 940 through barrier layer 950 and metal layer 960. The surface area of metal layer 960 and barrier layer 950 contacting N+ diffusion 940 is very large relative to the surface area of plug 920 and barrier layer 930 contacting N+ diffusion 940. As a result, the effect of metal layer 960 on the lifetime of structure 900 is negligible.

Similarly, FIG. 9B shows a substantially identical structure 900' with a plug 920' and barrier layer 930' connecting metal-1 layer 910' with N+ diffusion 940'. However, in structure 900', current $I_3$ is conducted in the reverse direction.

In this embodiment, current $I_3$ is a substantially constant 20 mA, and the structures are heated to approximately 175° C. The failure criterion is a 4% increase in resistance. Although voids due to electromigration are not likely to occur in N+ diffusion 940' with reverse current, the thickness of barrier layer 930' still has some affect on the speed and lifetime of structure 900' in the reverse current direction. Thus, it is useful to test structure 900' in both current directions and with different thickness of barrier layer 930' to determine an optimal barrier layer thickness.

The foregoing has described the principles and preferred embodiments of the present invention. However, the invention should not be construed as being limited to the particular embodiments described. For example, different types of interconnect structures having a barrier layer can be tested (e.g., with or without a plug). Also, the interconnect between different metal layers of a structure containing more than two metal layers may be tested. Further, the resistance of the barrier layer may be varied by methods other than varying the barrier layer's thickness (e.g., using different materials for the barrier layer). Still further, the test structures may be stressed under conditions different from those described above. Thus, the above-described embodiments should be regarded as illustrative rather than restrictive. Variations can be made to those embodiments by workers skilled in the art without departing from the scope of the present invention as defined by the following claims.

We claim:

1. A method for determining an optimal barrier layer, said method comprising the steps of:

providing first and second pluralities of test structures, each of said test structures comprising a first conductor, a diffusion region provided in a semiconductor material, a first barrier layer provided between the diffusion region and the first conductor, a second conductor and a second barrier layer provided between the second conductor and the diffusion region, wherein each of said first and second barrier layers in said first plurality of test structures has a first thickness and each of said first and second barrier layers in said second plurality of test structures has a second thickness;

conducting a first current through each of a first group of test structures selected from said first plurality of test structures, and measuring a first value of lifetime according to a time-to-failure criterion, said first current flowing in each test structure in said first group of test structures from the first conductor to the second conductor;

conducting a second current through each of a second group of test structures selected from said first plurality of test structures, and measuring a second value of lifetime according to said time-to-failure criterion, said second current flowing in each structure in said second group of test structures from the second conductor to the first conductor;

conducting a third current through each of a third group of test structures selected from said second plurality of test structures, and measuring a third value of lifetime according to said time-to-failure criterion, said third current flowing in each test structure in said third group of test structures from the first conductor to the second conductor;

conducting a fourth current through each of a fourth group of test structures selected from said second plurality of test structures, and measuring a fourth value of lifetime according to said time-to-failure criterion, said fourth current flowing in each test structure in said fourth group of test structures from the second conductor to the first conductor; and determining a thickness based on said first, second, third and fourth lifetimes in relation to said first and second thicknesses.

2. The method of claim 1, wherein, in each of said conducting steps, heat is applied to the test structures.

3. The method of claim 1, wherein said first, second, third and fourth currents are substantially equal in magnitude.

4. The method of claim 1, wherein said second thickness is greater than said first thickness.

5. The method of claim 1, wherein each of said measuring steps measures a change in resistance in the test structures.

6. The method of claim 1, wherein said time-to-failure criterion provides a value of lifetime equal to the time after which a selected percentage of a group of test structures achieve a predetermined percentage increase in resistance.

7. The method of claim 1, wherein each of said first, second, third and fourth currents is approximately 20 mA.

8. The method of claim 6, wherein said selected percentage is 50%.

9. The method of claim 6, wherein said predetermined percentage increase in resistance is approximately 4%.

10. The method of claim 1, wherein each of said measuring steps is conducted at approximately 175° F.

11. The method of claim 1, further comprising a step of determining an optimal barrier thickness in which said conducting and measuring steps are repeated for test structures having various selected values of said first and second thicknesses until either said first and fourth values of lifetime are substantially equal, or said second and third values of lifetime are substantially equal.

* * * * *